United States Patent
Iwaki

(10) Patent No.: US 12,207,413 B2
(45) Date of Patent: Jan. 21, 2025

(54) COMPONENT SUPPLY METHOD AND COMPONENT SUPPLY DEVICE

(71) Applicant: FUJI CORPORATION, Chiryu (JP)

(72) Inventor: Noriaki Iwaki, Hekinan (JP)

(73) Assignee: FUJI CORPORATION, Chiryu (JP)

(*) Notice: Subject to any disclaimer, the term of this patent is extended or adjusted under 35 U.S.C. 154(b) by 76 days.

(21) Appl. No.: 18/001,039

(22) PCT Filed: Jul. 8, 2020

(86) PCT No.: PCT/JP2020/026706
§ 371 (c)(1),
(2) Date: Dec. 7, 2022

(87) PCT Pub. No.: WO2022/009336
PCT Pub. Date: Jan. 13, 2022

(65) Prior Publication Data
US 2023/0225097 A1    Jul. 13, 2023

(51) Int. Cl.
*H05K 13/02*    (2006.01)
*H05K 13/04*    (2006.01)

(52) U.S. Cl.
CPC ......... H05K 13/022 (2013.01); H05K 13/028 (2013.01); H05K 13/043 (2013.01)

(58) Field of Classification Search
CPC .. H05K 13/022; H05K 13/028; H05K 13/043; B65B 43/46; B65G 17/323; B65G 47/847; B65G 27/32; B65G 43/08; B65G 2203/041; B65G 2203/044; B65G 47/12; B65G 47/16; B65G 47/24; B65G 47/58; B65G 47/256; B65G 47/1471; B65G 47/1492

USPC ......................................................... 198/373
See application file for complete search history.

(56) References Cited

U.S. PATENT DOCUMENTS

| 9,949,417 B2 * | 4/2018 | Morikawa ............ B23P 19/001 |
| 2017/0238448 A1 * | 8/2017 | Iwaki ................. H05K 13/028 700/223 |
| 2018/0035581 A1 * | 2/2018 | Matsumoto ........ H05K 13/0813 |
| 2018/0049352 A1 * | 2/2018 | Matsumoto ........ H05K 13/0452 |

(Continued)

FOREIGN PATENT DOCUMENTS

| JP | 2017191889 A | * 10/2017 | |
| JP | 2019021943 A | * 2/2019 | ............. B23P 19/00 |

(Continued)

OTHER PUBLICATIONS

International Search Report mailed on Sep. 24, 2020 in PCT/JP2020/026706 filed on Jul. 8, 2020 (2 pages).

*Primary Examiner* — Gene O Crawford
*Assistant Examiner* — Muhammad Awais
(74) *Attorney, Agent, or Firm* — Oblon, McClelland, Maier & Neustadt, L.L.P.

(57) ABSTRACT

A component supply method of supplying components scattered on a stage, includes a storage step of storing position information indicating a position of a component, posture information indicating a posture of the component, and number information indicating the number of components based on imaging data of the components scattered on the stage, and a holding step of holding the components scattered on the stage with a holding tool based on the position information and the posture information stored in the storage step.

7 Claims, 15 Drawing Sheets

(56) References Cited

U.S. PATENT DOCUMENTS

| | | | |
|---|---|---|---|
| 2018/0064004 A1* | 3/2018 | Matsumoto | .......... H05K 13/043 |
| 2020/0170154 A1 | 5/2020 | Sugihara | |
| 2020/0275590 A1 | 8/2020 | Nakayama | |

FOREIGN PATENT DOCUMENTS

| | | | | |
|---|---|---|---|---|
| JP | 2019050404 A | * | 3/2019 | .............. B23P 19/00 |
| JP | 2019197930 A | * | 11/2019 | .............. B25J 13/08 |
| JP | 2020047941 A | * | 3/2020 | ........... H05K 13/022 |
| WO | WO-2017208325 A1 | * | 12/2017 | .............. B23P 19/00 |
| WO | WO-2019053888 A1 | * | 3/2019 | .............. B65G 47/90 |

* cited by examiner

FIG. 14

| NUMBER OF TIMES | TOTAL NUMBER OF COMPONENTS | HOLDABLE NUMBER A | HOLDABLE NUMBER B | HOLDABLE PROBABILITY(%) | STACKED NUMBER | VACANT AREA RATIO(%) |
|---|---|---|---|---|---|---|
| 1 | 50 | 20 | 4 | 48% | 10 | 30% |
| 2 | 26 | 10 | 1 | 42% | 5 | 50% |
| 3 | 15 | 6 | 0 | 40% | 2 | 70% |
| 4 | 9 | 3 | 0 | 33% | 0 | 90% |
| .... | .... | .... | .... | .... | .... | .... |

COMPONENT SUPPLY METHOD AND COMPONENT SUPPLY DEVICE

TECHNICAL FIELD

The present invention relates to a component supply method and a component supply device for supplying components scattered on a stage.

BACKGROUND ART

As disclosed in the following Patent Literatures, some component supply devices supply components scattered on a stage.

PATENT LITERATURE

Patent Literature 1: WO 2019/053888
Patent Literature 2: WO 2017/208325

SUMMARY OF THE INVENTION

Technical Problem

An object of the present specification is to appropriately supply a component on a stage in a component supply device.

Solution to Problem

In order to solve the above problems, according to the present specification, there is provided a component supply method of supplying components scattered on a stage, the component supply method including a storage step of storing position information indicating a position of a component, posture information indicating a posture of the component, and number information indicating the number of components based on imaging data of the components scattered on the stage; and a holding step of holding the components scattered on the stage with a holding tool based on the position information and the posture information stored in the storage step. According to the present specification, there is provided a component supply method of supplying components scattered on a stage, the component supply method including a calculation step of calculating position information indicating a position of a component, posture information indicating a posture of the component, and number information indicating the number of components based on imaging data of the components scattered on the stage; a holding step of holding the components scattered on the stage with a holding tool by using the position information and the posture information calculated in the calculation step; a determination step of determining whether to change parameters at the time of image processing on the imaging data in the calculation step based on the number information calculated in the calculation step; and a changing step of changing the parameters at the time of the image processing on the imaging data in the calculation step in a case where it is determined to change the parameters in the determination step.

Advantageous Effect of the Invention

According to the present disclosure, it is possible to appropriately supply a component on a stage using the position information, the posture information, and the number information.

BRIEF DESCRIPTION OF DRAWINGS

FIG. 14 is a diagram illustrating a total number of components, a holdable number, a holdable probability, a stacked number, and a vacant area ratio stored in a storage device.

DESCRIPTION OF EMBODIMENTS

Hereinafter, as exemplary embodiments of the present invention, examples of the present invention will be described in detail with reference to drawings.

Figure 1:
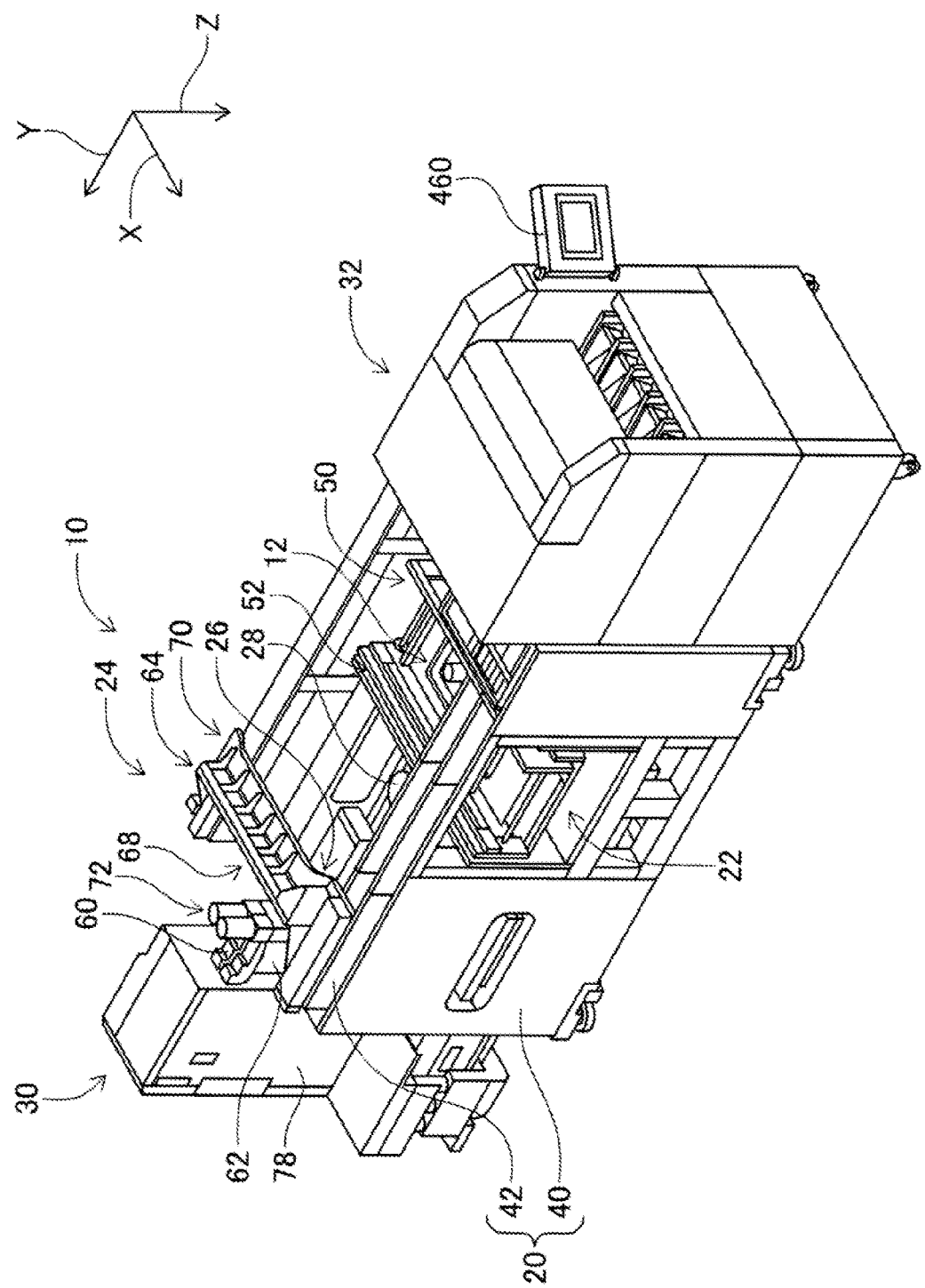
FIG. 1 is a perspective view illustrating a component mounter.

FIG. 1 illustrates component mounter 10. Component mounter 10 is a device that executes mounting work of a component on circuit base material 12. Component mounter 10 includes device main body 20, base material conveyance/holding device 22, component attachment device 24, imaging devices 26, 28, component supply device 30, bulk component supply device 32, and control device (refer to FIG. 11) 34. Examples of circuit base material 12 include a circuit board and a base material having a three-dimensional structure, and examples of the circuit board include a printed wiring board and a printed circuit board.

Device main body 20 includes frame 40 and beam 42 suspended on frame 40. Base material conveyance/holding device 22 is disposed at the center of frame 40 in a front-rear direction, and has conveyance device 50 and clamp device 52. Conveyance device 50 is a device that conveys circuit base material 12, and clamp device 52 is a device that holds circuit base material 12. As a result, base material conveyance/holding device 22 conveys circuit base material 12 and fixedly holds circuit base material 12 at a predetermined position. In the description below, a conveyance direction of circuit base material 12 will be referred to as an X direction, a horizontal direction perpendicular to that direction will be referred to as a Y direction, and a vertical direction will be referred to as a Z direction. That is, a width direction of component mounter 10 is the X-direction, and a front-rear direction is the Y-direction.

Figure 2:
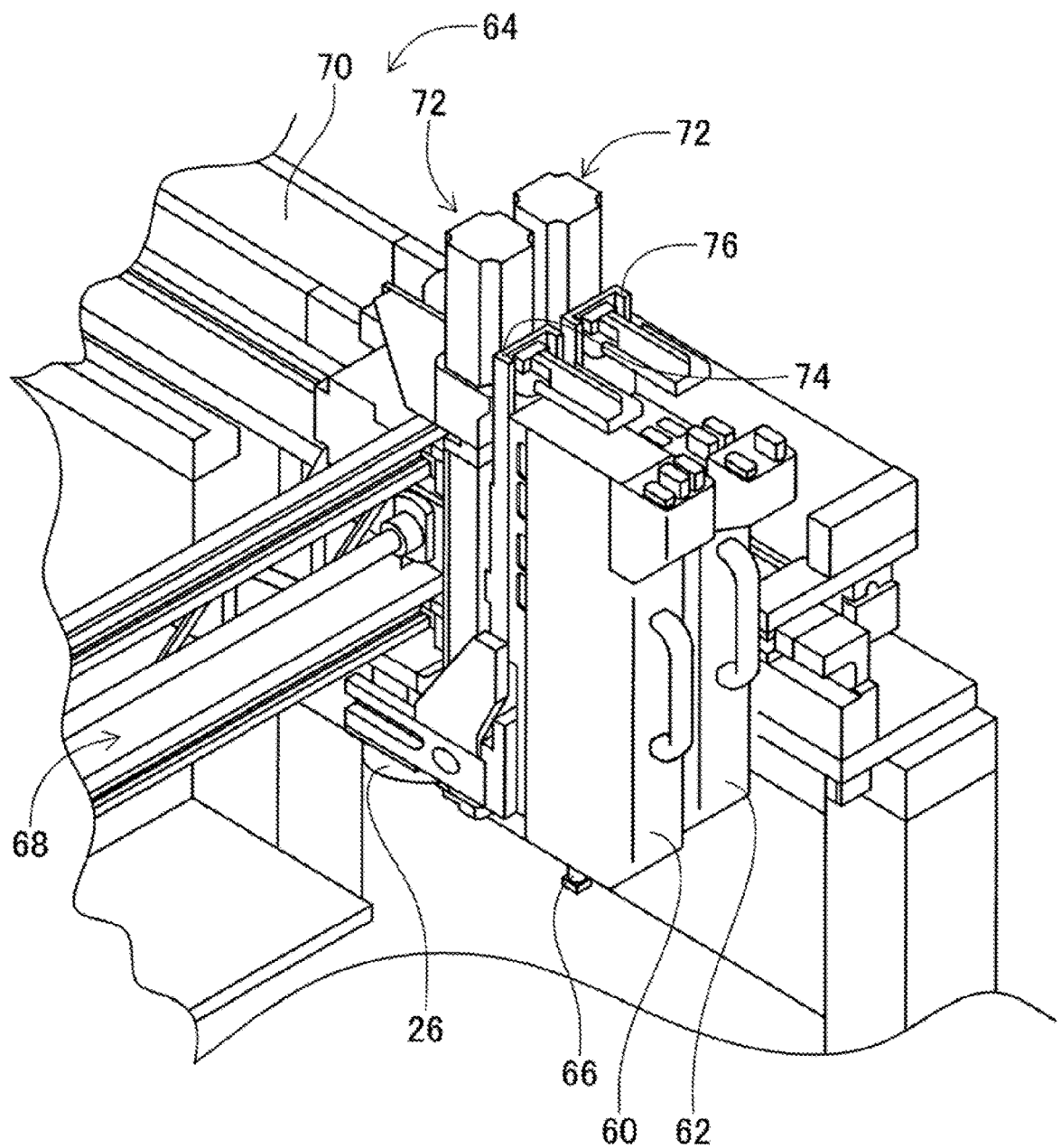
FIG. 2 is a perspective view illustrating a component attachment device of the component mounter.

Component attachment device 24 is disposed on beam 42 and includes two work heads 60 and 62 and work head moving device 64. Work heads 60 and 62 each include suction nozzle (refer to FIG. 2) 66 and hold a component by using suction nozzle 66. Work head moving device 64 includes X-direction moving device 68, Y-direction moving device 70, and Z-direction moving device 72. Two work heads 60 and 62 are integrally moved to any position on frame 40 by X-direction moving device 68 and Y-direction moving device 70. As illustrated in FIG. 2, each of work heads 60 and 62 is detachably attached to sliders 74 and 76, and Z-direction moving device 72 individually moves sliders 74 and 76 in the up-down direction. That is, work heads 60 and 62 are individually moved in the up-down direction by Z-direction moving device 72.

Imaging device 26 is attached to slider 74 in a state in which imaging device 26 is directed downward and is moved in the X-direction, Y-direction, and Z-direction together with work head 60. Consequently, imaging device 26 images any position on frame 40. As illustrated in FIG. 1, imaging device 28 is disposed between base material conveyance/holding device 22 on frame 40 and component supply device 30 in a state in which imaging device 28 is directed upward. Consequently, imaging device 28 images components held by suction nozzles 66 of work heads 60 and 62.

Component supply device 30 is disposed at a first end part of frame 40 in the front-rear direction. Component supply device 30 includes tray-type component supply device 78 and a feeder-type component supply device (not illustrated). Tray-type component supply device 78 is a device that supplies a component in a state of being placed on a tray. The feeder-type component supply device is a device that supplies a component with a tape feeder (not illustrated) or a stick feeder (not illustrated).

Bulk component supply device 32 is disposed at a second end part of frame 40 in the front-rear direction. Bulk component supply device 32 is a device that aligns multiple components in a scattered state and supplies the components in an aligned state. That is, bulk component supply device 32 is a device that aligns multiple components in any posture into a predetermined posture, and supplies the components in the predetermined posture. Hereinafter, a configuration of component supply device 32 will be described in detail. Examples of components which are supplied by component supply device 30 and bulk component supply device 32 include electronic circuit components, constituent components of a solar cell, and constituent components of a power module. The electronic circuit components include a component with a lead, a component without a lead, and the like.

Figure 3:
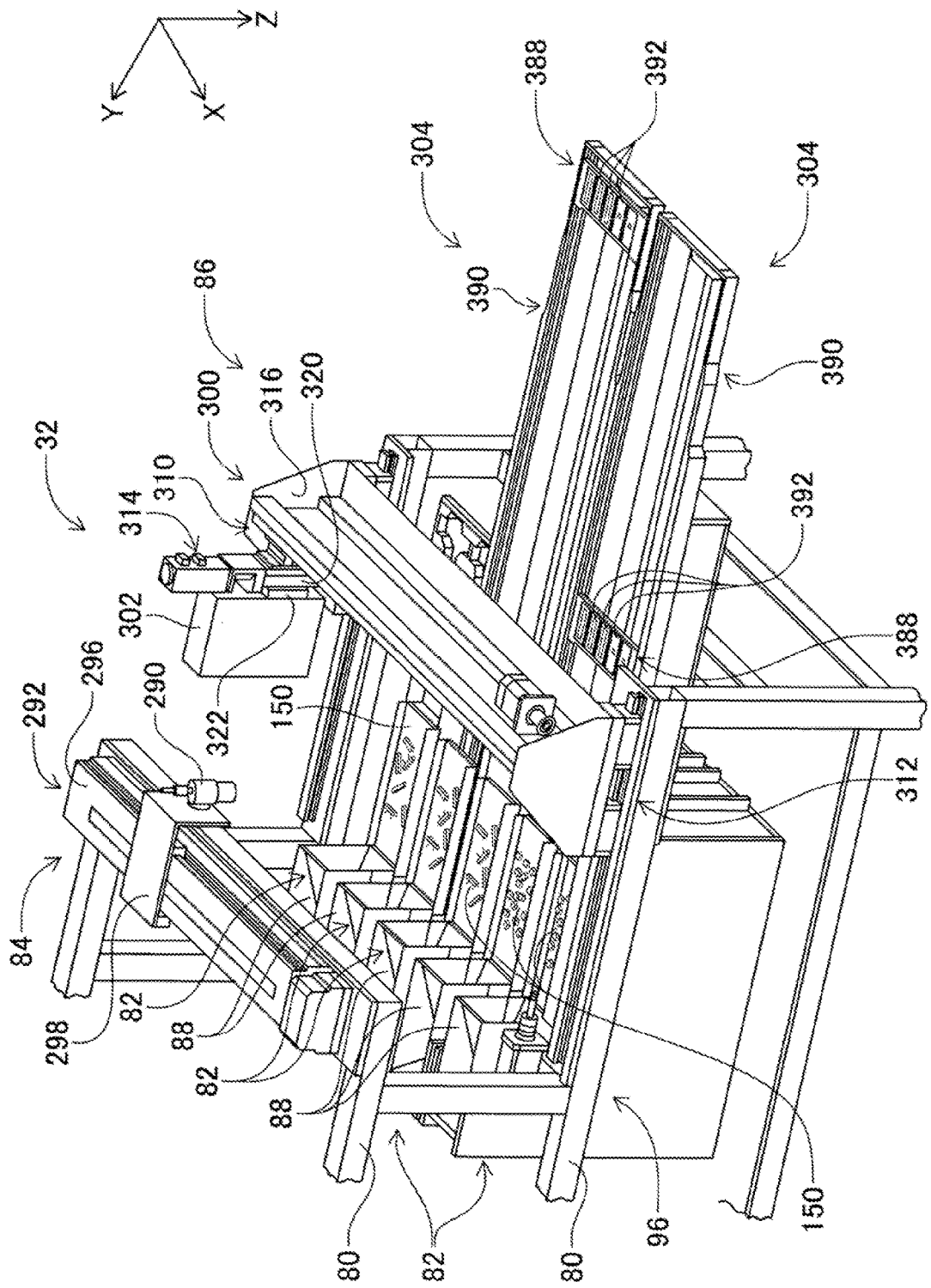
FIG. 3 is a perspective view illustrating a bulk component supply device.

Bulk component supply device 32, as illustrated in FIG. 3, has main body 80, component supply unit 82, imaging device 84, and component delivery device 86.

Component supply unit 82 includes component feeder 88, component scattering device (refer to FIG. 4) 90, and component return device (refer to FIG. 4) 92, and component feeder 88, component scattering device 90, and component return device 92 are integrally configured. Component supply unit 82 is detachably assembled to base 96 of main body 80, and in bulk component supply device 32, five component supply units 82 are arranged in a line in the X-direction.

Figure 4:
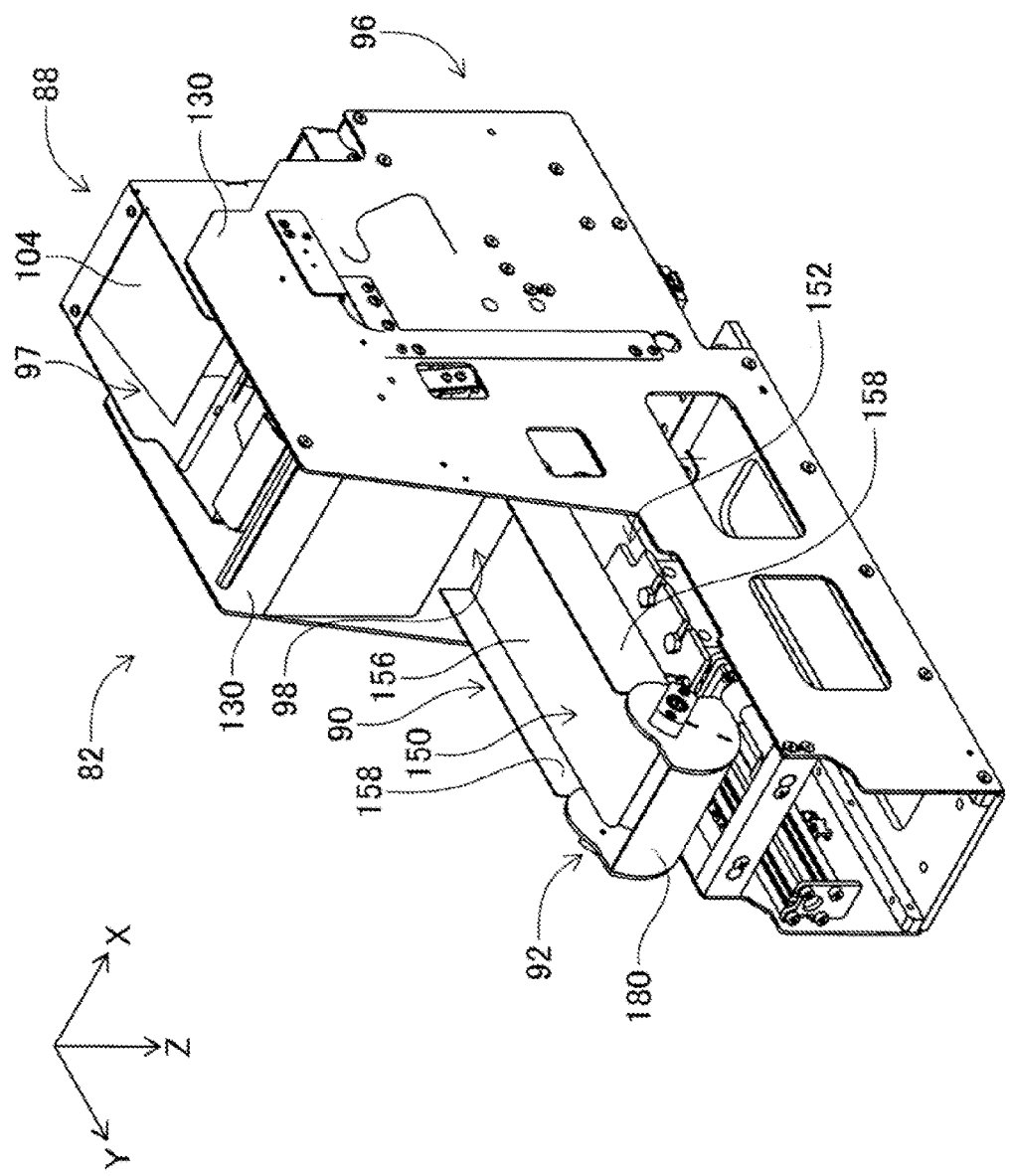
FIG. 4 is a perspective view illustrating a component supply unit.
Figure 5:
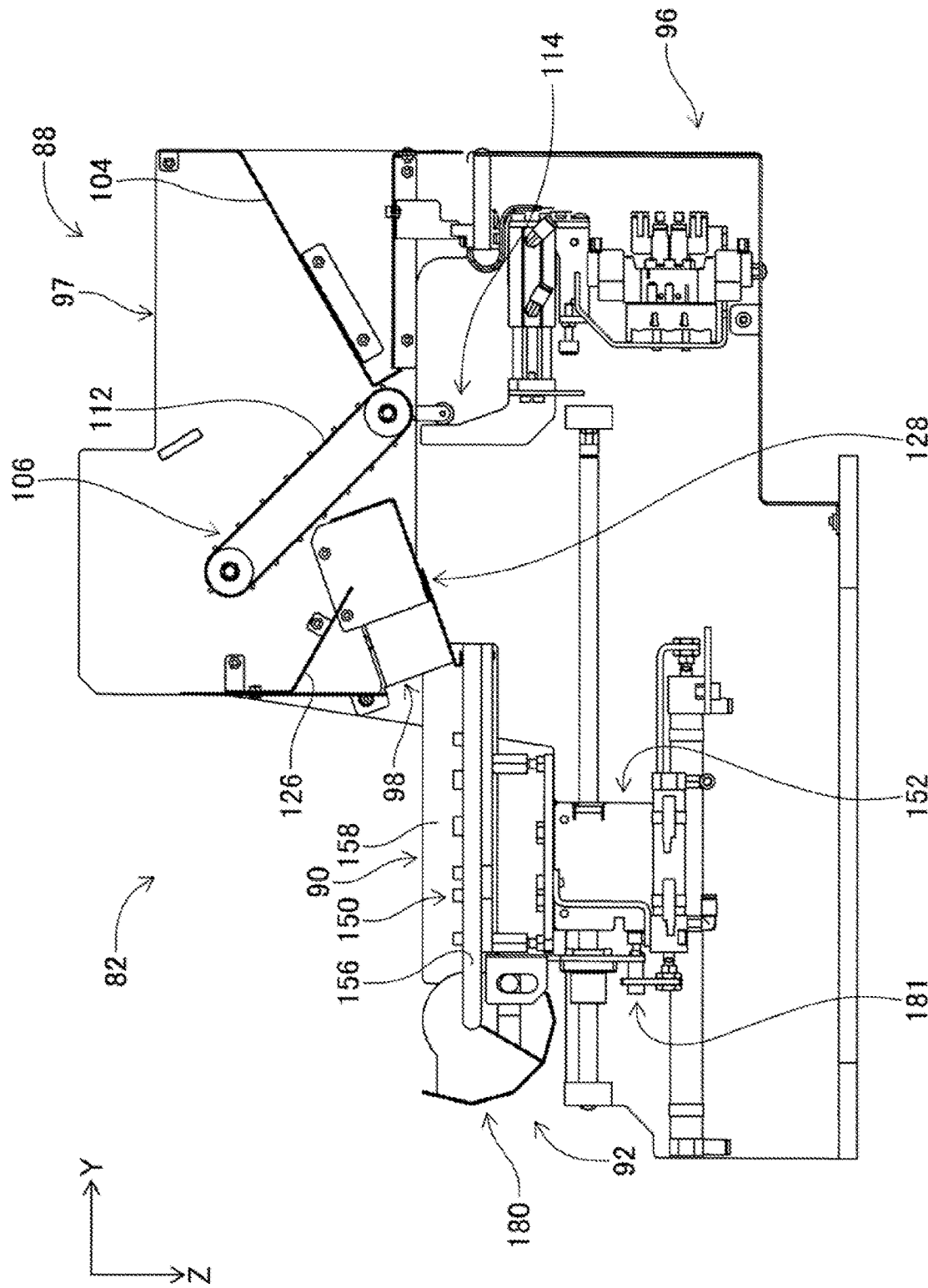
FIG. 5 is a transparent view illustrating the component supply unit.

Component feeder 88 has a box shape that is a generally rectangular parallelepiped, as illustrated in FIGS. 4 and 5, and is disposed to extend in the Y-direction. The Y-direction will be referred to as a front-rear direction of component feeder 88, and in component supply unit 82, a direction toward the side in which component return device 92 is disposed will be referred to as a front direction, and the direction toward the side in which component feeder 88 is disposed will be referred to as a rear direction.

Component feeder 88 is opened in an upper surface and a front surface thereof, and an opening in the upper surface serves as component input port 97, while an opening in the front surface serves as component discharge port 98. In component feeder 88, inclined plate 104 is disposed below input port 97. Inclined plate 104 is disposed in such a manner as to be inclined downward in a direction toward the center of component feeder 88 from a rear end surface thereof.

Conveyor device 106 is disposed in front of inclined plate 104, as illustrated in FIG. 5. Conveyor device 106 is disposed to be inclined upward from the front end part of inclined plate 104 toward the front of component feeder 88. Conveyor belt 112 of conveyor device 106 rotates counterclockwise in FIG. 5. That is, a conveyance direction of conveyor device 106 is obliquely upward from the front end part of inclined plate 104 to the front.

Inclined plate 126 is disposed below the front end part of conveyor device 106. Inclined plate 126 is disposed to extend from the front end surface of component feeder 88 toward below conveyor device 106, and the rear end part of inclined plate 126 is inclined obliquely downward. Inclined plate 128 is also disposed below inclined plate 126. Inclined plate 128 is inclined from below the center of conveyor device 106 toward discharge port 98 of component feeder 88 so that a front end part of inclined plate 128 is located downward.

As illustrated in FIG. 4, a pair of side frames 130 are assembled to base 96. Pair of side frames 130 are erected to extend parallel to each other and in the Y-direction while facing each other. A distance between pair of side frames 130 is slightly larger than a dimension of component feeder 88 in the width direction, and thus component feeder 88 is detachably attached between pair of side frames 130.

Component scattering device 90 includes component support member 150 and component support member moving device 152. Component support member 150 includes stage 156 and pair of side wall portions 158. Stage 156 has a generally longitudinal plate-like shape and is disposed to extend to the front from below component feeder 88 attached between pair of side frames 130. The upper surface of stage 156 is generally horizontal and is disposed, as illustrated in FIG. 5, with a slight clearance with respect to the front end part of inclined plate 128 of component feeder 88. As illustrated in FIG. 4, pair of side wall portions 158 are erected on both side portions in the longitudinal direction of stage 156 and fixed, and the upper end of each side wall portion 158 extends above the upper surface of stage 156.

Component support member moving device 152 slides component support member 150 in the Y-direction by operating air cylinder (refer to FIG. 11) 166. In this case, component support member 150 is moved between a retracted state (refer to FIG. 6) in which component support member 150 is retracted below component feeder 88 and an exposed state (refer to FIG. 5) in which component support member 150 is exposed from below component feeder 88.

Figure 7:
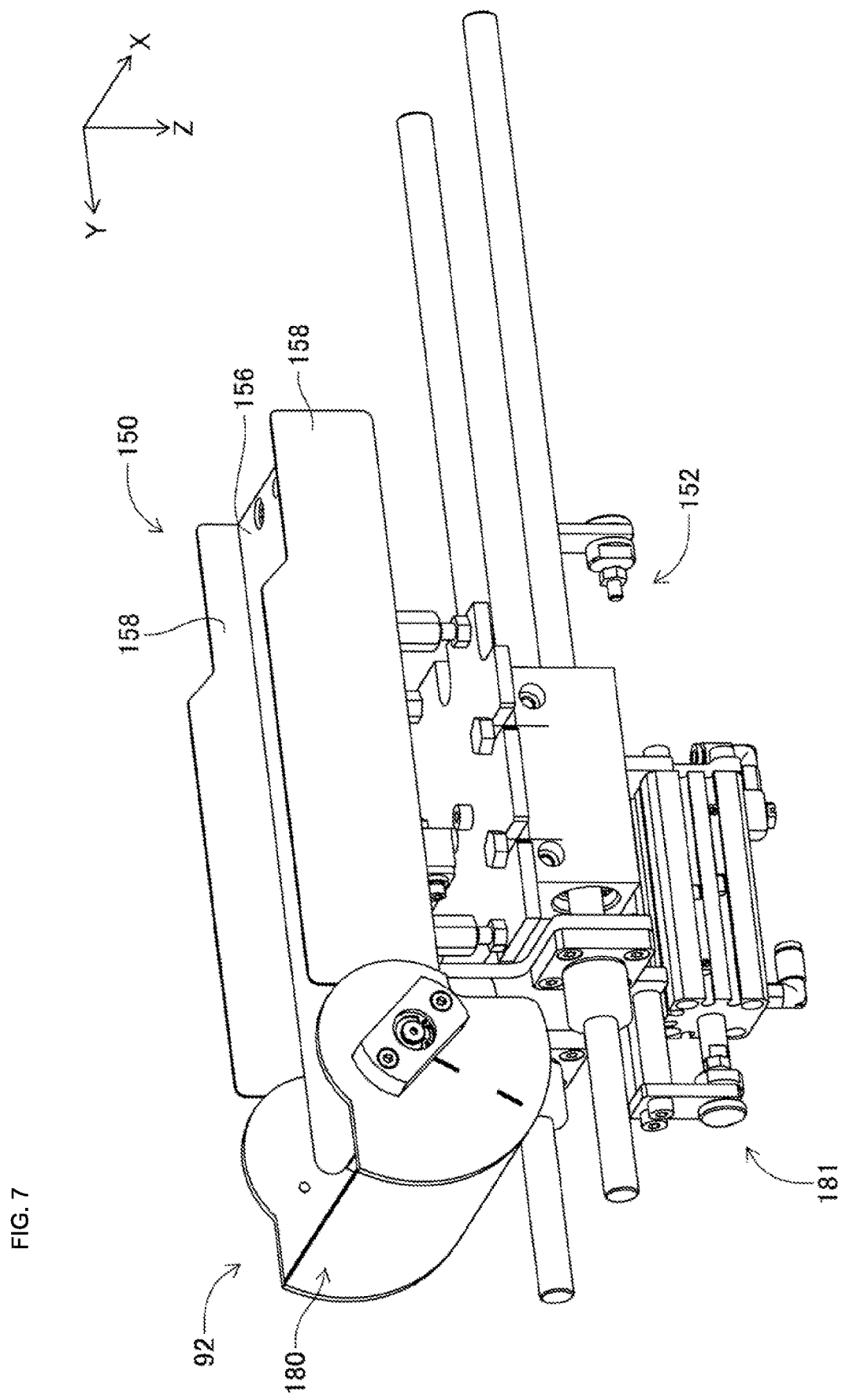
FIG. 7 is a perspective view illustrating a component scattering device.
Figure 8:
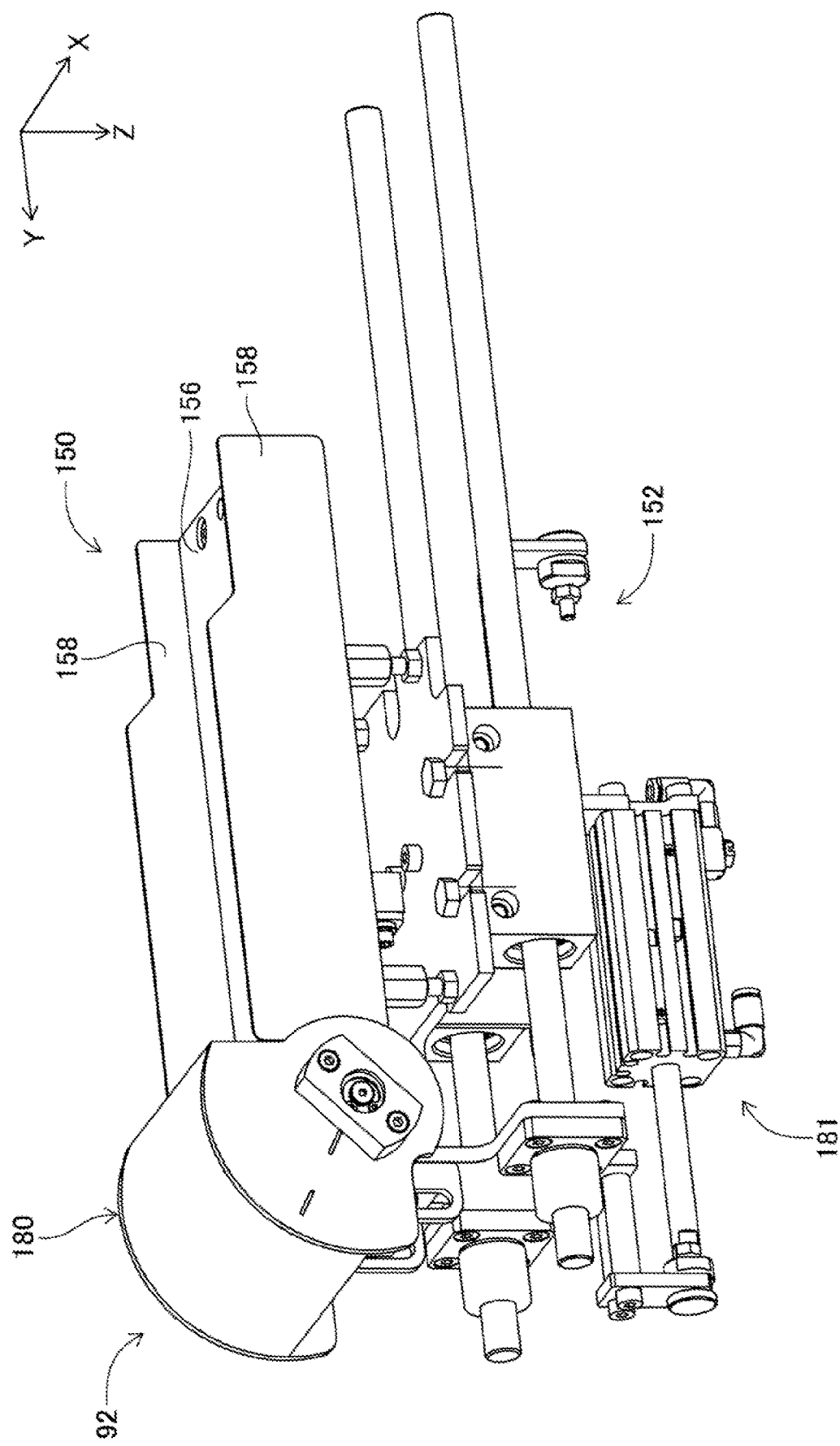
FIG. 8 is a perspective view illustrating a component scattering device.

As illustrated in FIG. 7, component return device 92 includes component accommodation container 180 and container swing device 181. Component accommodation container 180 has a generally box-like shape and an arc-shaped bottom surface. Component accommodation container 180 is held in a swingable manner at the front end part of stage 156 of component support member 150 and is swung through an operation of container swing device 181. In this case, component accommodation container 180 is swung between an accommodating posture in which an opening thereof faces upward (refer to FIG. 7) and a return posture in which the opening faces the upper surface of stage 156 of component support member 150 (refer to FIG. 8).

As illustrated in FIG. 3, imaging device 84 includes camera 290 and camera moving device 292. Camera moving device 292 includes guide rail 296 and slider 298. Guide rail 296 is fixed to main body 80 above component feeder 88 so as to extend in the width direction (X-direction) of bulk component supply device 32. Slider 298 is attached to guide rail 296 in a slidable manner and is slid to any position through electromagnetic motor 299 (refer to FIG. 11). Camera 290 is attached to slider 298 in a downward-facing state.

Component delivery device 86 includes, as illustrated in FIG. 3, component holding head moving device 300, component holding head 302, and two shuttle devices 304.

Component holding head moving device 300 includes X-direction moving device 310, Y-direction moving device 312, and Z-direction moving device 314. Y-direction moving device 312 has Y-slider 316 disposed above component supply unit 82 so as to extend in the X-direction and Y-slider 316 is moved to any position in the Y-direction through driving of electromagnetic motor (refer to FIG. 11) 319. X-direction moving device 310 has X-slider 320 disposed on a side face of Y-slider 316, and X-slider 320 is moved to any position in the X-direction through driving of electromagnetic motor (refer to FIG. 11) 321. Z-direction moving device 314 has Z-slider 322 disposed on a side face of X-slider 320, and Z-slider 322 is moved to any position in the Z-direction through driving of electromagnetic motor (refer to FIG. 11) 323.

Figure 9:
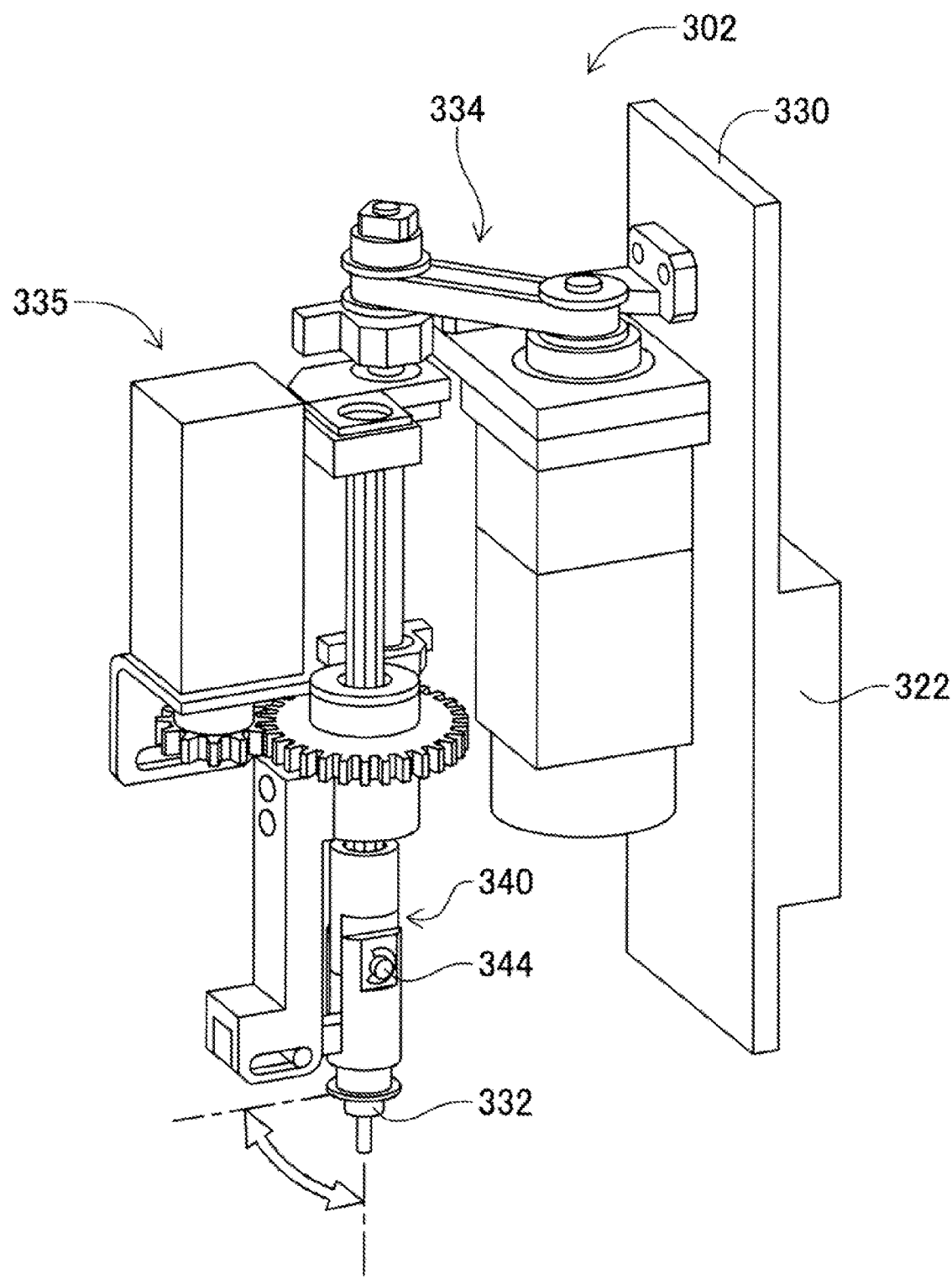
FIG. 9 is a perspective view illustrating a component holding head.

As illustrated in FIG. 9, component holding head 302 includes head main body 330, suction nozzle 332, nozzle pivoting device 334, and nozzle rotation device 335. Head main body 330 is formed integrally with Z-slider 322. Suction nozzle 332 holds a component and is detachably attached to a lower end part of holder 340. Holder 340 is bendable at support shaft 344, and holder 340 is bent upward by 90 degrees through an operation of nozzle pivoting device 334. Consequently, suction nozzle 332 which is attached to the lower end part of holder 340 is pivoted by 90 degrees and is located at a pivoted position. That is, suction nozzle 332 is pivoted between a non-pivoted position and a pivoted position through an operation of nozzle pivoting device 334. Of course, suction nozzle 332 may be positioned to stop at an angle position between the non-pivoted position and the pivoted position. Nozzle rotation device 335 rotates suction nozzle 332 around an axis center thereof.

As illustrated in FIG. 3, two shuttle devices 304 each include component carrier 388 and component carrier moving device 390 and are fixed to main body 80 to be aligned side by side in a lateral direction along the front side of component supply units 82. Component carrier 388 includes five component receiving members 392, which are attached thereto while being aligned in a row in the lateral direction, so that components are placed individually and separately on component receiving members 392.

Figure 10:
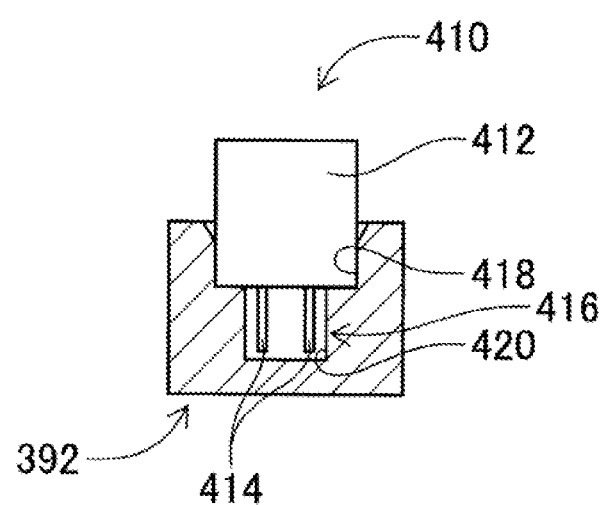
FIG. 10 is a diagram illustrating a component receiving member in a state in which electronic circuit components are housed.

Bulk component supply device 32 can supply various types of components, and thus various types of component receiving members 392 are prepared depending on shapes of components. Here, as an electronic circuit component supplied by bulk component supply device 32, as illustrated in FIG. 10, component receiving member 392 corresponding to lead component 410 having leads will be described. Lead component 410 includes block-shaped component main body 412 and two leads 414 protruding from the bottom surface of component main body 412.

Component receiving recessed portion 416 having a shape corresponding to a shape of lead component 410 is formed in component receiving member 392. Component receiving recessed portion 416 is a recessed portion having a stepped shape and includes main body portion receiving recessed portion 418 that is open to an upper surface of component receiving member 392, and lead accommodation recessed portion 420 that is open to a bottom surface of main body portion receiving recessed portion 418. Lead component 410 is inserted inside component receiving recessed portion 416 in a posture in which leads 414 are directed downward. Consequently, lead component 410 is placed inside component receiving recessed portion 416 in a state in which leads 414 are inserted into lead accommodation recessed portion 420 and component main body 412 is inserted into main body portion receiving recessed portion 418.

As illustrated in FIG. 3, component carrier moving device 390 is a plate-shaped elongated member disposed in front of component supply unit 82 so as to extend in the front-rear direction. Component carrier 388 is disposed on the upper surface of component carrier moving device 390 so as to be slidable in the front-rear direction, and is slid to any position in the front-rear direction through driving of electromagnetic motor (refer to FIG. 11) 430. When component carrier 388 is slid in a direction of approaching component supply unit 82, component carrier 388 is slid to a component receiving position located within a range in which component holding head 302 is movable by component holding head moving device 300. On the other hand, when component carrier 388 is slid in a direction of moving away from component supply units 82, component carrier 388 is slid to a component supply position which is located within a range in which work heads 60 and 62 are movable by work head moving device 64.

Figure 11:
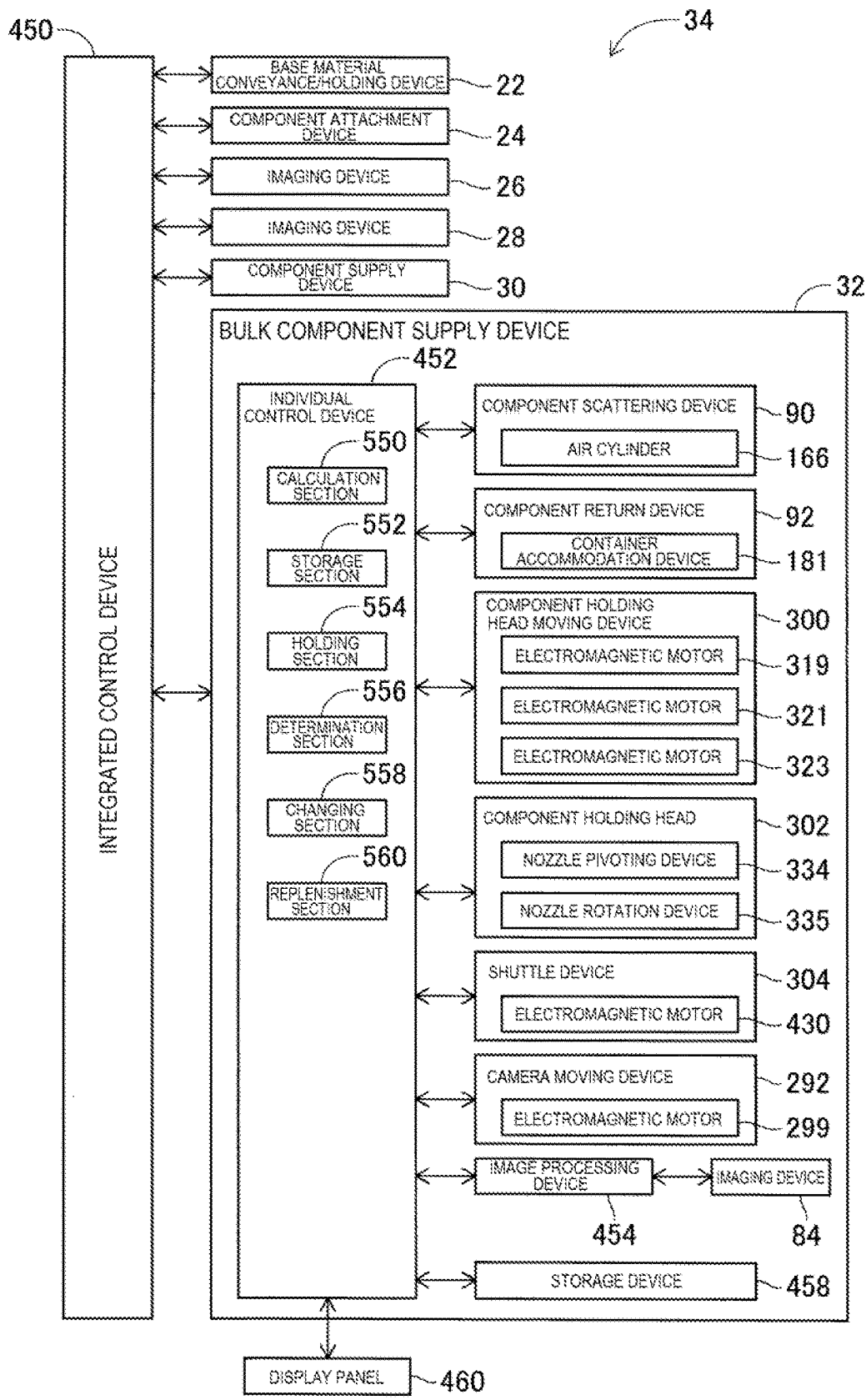
FIG. 11 is a block diagram illustrating a control device of the component mounter.

As illustrated in FIG. 11, control device 34 includes integrated control device 450, multiple individual control devices (only one is illustrated in FIG. 11) 452, and image processing device 454. Integrated control device 450 is mainly configured with a computer and is connected to base material conveyance/holding device 22, component attachment device 24, imaging device 26, imaging device 28, component supply device 30, and bulk component supply device 32. Consequently, integrated control device 450 integrally controls base material conveyance/holding device 22, component attachment device 24, imaging device 26, imaging device 28, component supply device 30, and bulk component supply device 32. Multiple individual control devices 452 each are mainly configured with a computer and are provided corresponding to base material conveyance/holding device 22, component attachment device 24, imaging device 26, imaging device 28, component supply device 30, and bulk component supply device 32 (in FIG. 11, only individual control device 452 corresponding to bulk component supply device 32 is illustrated).

Individual control device 452 for bulk component supply device 32 is connected to component scattering device 90, component return device 92, camera moving device 292, component holding head moving device 300, component holding head 302, and shuttle devices 304. Thus, individual control device 452 for bulk component supply device 32 controls component scattering devices 90, component return devices 92, camera moving device 292, component holding head moving device 300, component holding head 302, and shuttle devices 304. Image processing device 454 is connected to imaging device 84 and processes imaging data captured by imaging device 84. Image processing device 454 is connected to individual control device 452 for bulk component supply device 32. Thus, individual control device 452 for bulk component supply device 32 acquires the imaging data captured by imaging device 84.

Bulk component supply device 32 has storage device 458. Storage device 458 is connected to individual control device 452 and stores various types of information in response to a command from individual control device 452. Individual control device 452 is also connected to display panel 460. As illustrated in FIG. 1, display panel 460 is disposed on an end surface of bulk component supply device 32, and displays any screen in response to a command from individual control device 452.

With the configuration that has been described, component mounter 10 executes component mounting work on circuit base material 12 which is held by base material conveyance/holding device 22. Specifically, circuit base material 12 is conveyed to a work position and held at that position in a fixed manner by clamp device 52. Next, imaging device 26 is moved above circuit base material 12 and images circuit base material 12. consequently, information regarding an error in the holding position of circuit base material 12 is obtained. Component supply device 30 or bulk component supply device 32 supplies a component at a predetermined supply position. The supply of a component by bulk component supply device 32 will be described in detail later. Either of work heads 60 or 62 is moved above the component supply position to hold a component with suction nozzle 66. Subsequently, work head 60 or 62 which holds the component is moved above imaging device 28, and the component held by suction nozzle 66 is imaged by imaging device 28. Consequently, information regarding an error in the holding position of the component is obtained. Work head 60 or 62 holding the component is moved above circuit base material 12, and mounts the held component on circuit base material 12 after correcting the error of the holding position of circuit base material 12, the error of the holding position of the component, and the like.

In bulk component supply device 32, lead component 410 is input from input port 97 of component feeder 88 by an operator, and input lead component 410 is supplied in a state of being placed on component receiving member 392 of component carrier 388 through an operation of component supply unit 82 and component delivery device 86.

Specifically, the operator inputs lead components 410 from input port 97 in the upper surface of component feeder 88. In this case, component support member 150 is moved into a retracted state below component feeder 88 through an operation of component support member moving device 152 (refer to FIG. 6). When component support member 150 is in the retracted state, component accommodation container 180 disposed at the front end part of component support member 150 is located in front of component feeder 88 to be in a posture (accommodating posture) in which the opening of component accommodation container 180 is directed upward.

Lead component 410 input from input port 97 of component feeder 88 falls on inclined plate 104 of component feeder 88 and rolls down to the front lower end of inclined plate 104. Lead components 410, which have rolled down to the front lower end of inclined plate 104, are piled up between the front lower end of inclined plate 104 and the rear lower end of conveyor device 106. By operating conveyor device 106, conveyor belt 112 of conveyor device 106 rotates counterclockwise in FIG. 6. Consequently, lead components 410 piled up between inclined plate 104 and conveyor belt 112 are conveyed obliquely upward by conveyor belt 112.

Lead components 410 conveyed by conveyor belt 112 fall onto inclined plate 126 from the front upper end of conveyor device 106. Lead components 410, which have fallen on inclined plate 126, roll down on inclined plate 126 toward the rear to fall onto inclined plate 128. Lead components 410, which have fallen on inclined plate 128, roll down toward the front and are discharged from discharge port 98 on the front side of component feeder 88.

Consequently, lead components 410 discharged from discharge port 98 of component feeder 88 are accommodated inside component accommodation container 180. When a predetermined amount of lead components 410 is discharged from component feeder 88, that is, when conveyor device 106 is operated by a certain amount, conveyor device 106 is stopped. Next, component support member 150 is moved from the retracted state toward the front through an operation of component support member moving device 152.

Container swing device 181 of component return device 92 is operated at a timing at which component support member 150 has been moved a predetermined amount from the retracted state toward the front, and swings component accommodation container 180. Consequently, a posture of component accommodation container 180 changes vigorously from a posture (accommodating posture) in which the opening is directed upward to a posture (return posture) in which the opening is directed toward stage 156. In this case, lead components 410 accommodated in component accommodation container 180 are vigorously released toward stage 156. Consequently, lead components 410 are scattered on stage 156 from component accommodation container 180.

Figure 12:
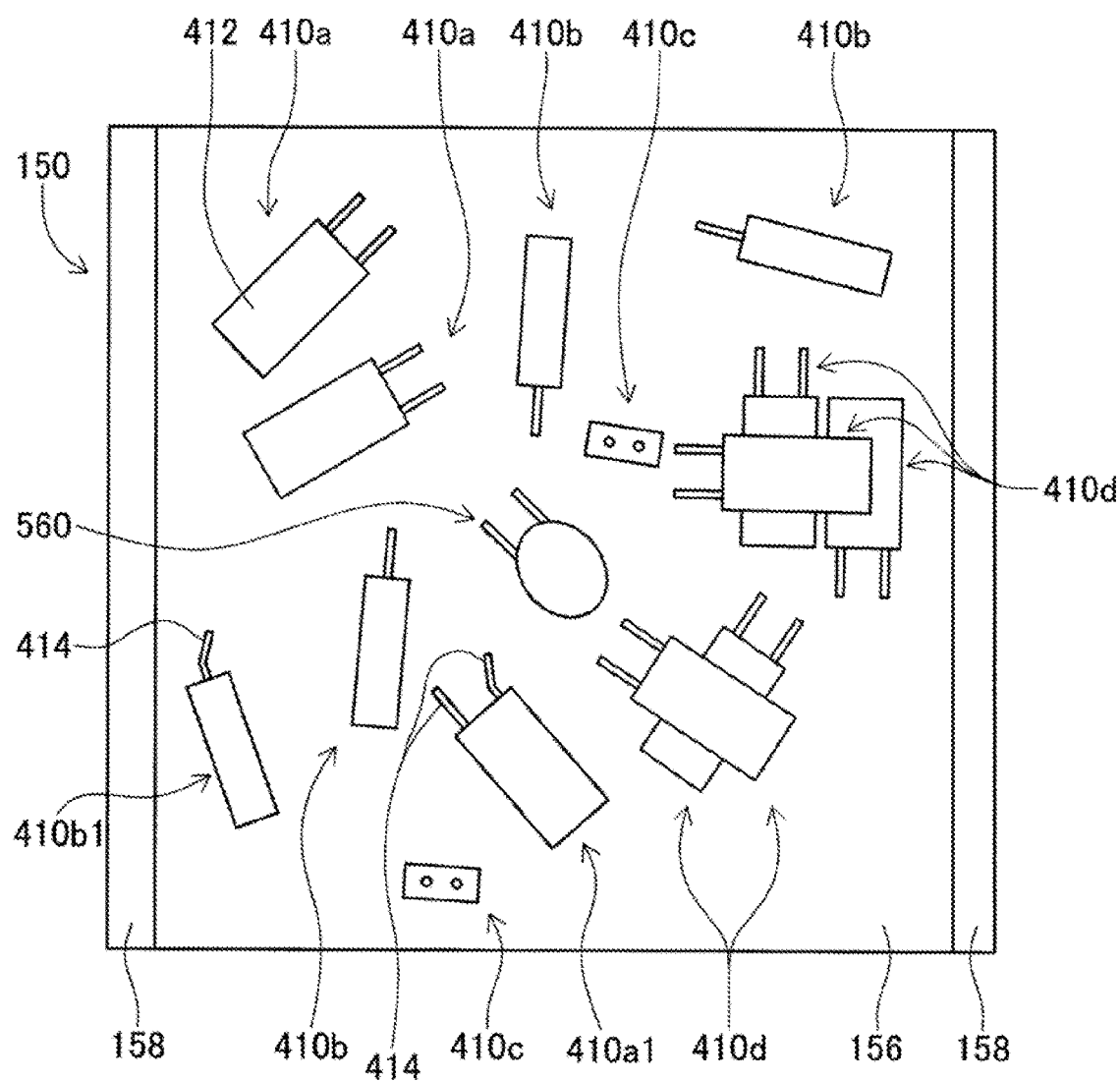
FIG. 12 is a diagram illustrating a state in which lead components are scattered on a stage.

When lead components 410 are scattered on stage 156 of component support member 150, lead components 410 are scattered on stage 156 in substantially four postures as illustrated in FIG. 12. Specifically, in the first posture, lead components 410 are scattered in a posture in which the surface from which lead 414 extends is directed laterally and two leads 414 are generally aligned horizontally. In the second posture, lead components 410 are scattered in a posture in which the surface from which lead 414 extends is directed laterally and two leads 414 are generally aligned vertically. In the third posture, lead components 410 are scattered in a posture in which the surface from which lead 414 extends is directed upward. In the fourth posture, lead components 410 are scattered in a posture in which two or more lead components 410 overlap with each other. When distinguishing lead components 410 by the postures in which lead components 410 are scattered, lead components 410 will be described as lead component 410a in the first posture, lead component 410b in the second posture, lead component 410c in the third posture, and lead component 410d in the fourth posture. Incidentally, in FIG. 12, lead components 500 having shapes different from those of lead component 410 are also scattered on stage 156. This is because the operator mistakenly inputs lead component 500 of a different type from lead component 410 into component feeder 88, and the lead components 500 of different types are scattered on the stage in a state in which they are mixed in lead component 410.

When lead components 410 are scattered on stage 156 as described above, camera 290 of imaging device 84 is moved above component support member 150 through an operation of the camera moving device 292. In this case, lead components 410 scattered on stage 156 are imaged by camera 290. Since an angle of view of camera 290, that is, an imaging range is wider than stage 156, the entire stage 156, that is, all lead components 410 scattered on stage 156 are imaged through imaging performed once. Based on the imaging data captured by camera 290, lead components that are pickup targets (hereinafter, abbreviated to "pickup target components" in some cases) are specified through pattern matching.

Figure 13:
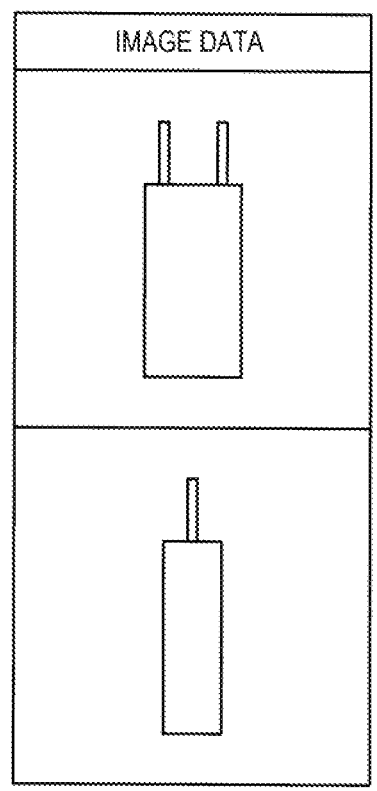
FIG. 13 is a diagram illustrating a lead component recognized through pattern matching.

Specifically, an outer edge of lead component 410, that is, an outline, is specified based on the imaging data of lead component 410 from camera 290, and a shape of the upper surface of lead component 410, that is, a shape at the viewpoint above lead component 410 is calculated. A position of lead component 410 is also calculated based on the imaging data. On the other hand, as illustrated in FIG. 13, image data of a shape corresponding to the outline of lead component 410a in the first posture (hereinafter, abbreviated to "first posture component image data" in some cases) and image data of a shape corresponding to the outline of lead component 410b in the second posture (hereinafter, abbreviated to "second posture component image data" in some cases) are stored in storage device 458.

It is determined whether the shape of the upper surface of lead component 410 calculated based on the imaging data (hereinafter, referred to as an "imaged component shape" in some cases) matches the shape of lead component 410 based on the first posture component image data (hereinafter, referred to as a "first storage component shape" in some cases) or the shape of lead component 410 based on the second posture component image data (hereinafter, referred to as a "second storage component shape" in some cases). In a case where it is determined that the imaged component shape matches the first storage component shape or the second storage component shape, lead component 410 corresponding to the imaged component shape is set as a pickup target component.

That is, lead component 410a in the first posture and lead component 410b in the second posture are set as pickup target components, and lead component 410c in the third posture and lead component 410d in the fourth posture are not set as pickup target components. This is because in lead component 410c in the third posture, lead 414 is disposed on the upper surface such that lead 414 obstructs suction nozzle 332, and thus lead component 410 cannot be appropriately held. This is because in lead component 410d in the fourth posture, lead component 410 cannot be appropriately held by suction nozzle 332 due to a reason such as a fact that the upper surface of lead component 410d is not horizontal. As described above, lead component 410a in the first posture and lead component 410b in the second posture are set as pickup target components, and are stored in storage device 458 as information indicating the posture of the lead component.

In FIG. 12, a lead component in the first posture in which lead 414 is bent, that is, lead component 410a1 that is a defective product in the first posture (hereinafter, referred to as a "defective product in the first posture") is scattered, and a shape in which lead 414 is bent does not match the first storage component shape. Therefore, defective product 410a1 in the first posture is not set as a pickup target component. A lead component in the second posture in which lead 414 is bent, that is, lead component 410b1 that is a defective product in the second posture (hereinafter, referred to as a "defective product in the second posture") is scattered, and a shape in which lead 414 is bent does not match the second storage component shape. Thus, defective product 410b1 in the second posture is also not set as a pickup target component. Since a shape of lead component 500 having a shape different from that of lead component 410 naturally does not match the first storage component shape and the second storage component shape, lead component 500 is not set as a pickup target component.

Information indicating a position of lead component 410 set as a pickup target component is calculated based on the imaging data. Next, based on the calculated information indicating the position of the pickup target component, component holding head 302 is moved above the pickup target component through an operation of component holding head moving device 300, and thus the pickup target component is picked up and held by suction nozzle 332. When the pickup target component is being picked up and held by suction nozzle 332, suction nozzle 332 is located at the non-pivoted position.

Next, component holding head 302 is moved above component carrier 388 after lead component 410 is held by suction nozzle 332. In this case, component carrier 388 is then moved to the component receiving position through an operation of component carrier moving device 390. When component holding head 302 is moved above component carrier 388, suction nozzle 332 is pivoted to the pivoted position. Suction nozzle 332 is pivoted through an operation of nozzle rotation device 335 such that lead 414 of lead component 410 held by suction nozzle 332 at the pivoted position is directed downward in the vertical direction.

When component holding head 302 is moved above component carrier 388, lead component 410 of which lead 414 is directed downward in the vertical direction is inserted into component receiving recessed portion 416 of component receiving member 392. Consequently, lead component 410 is placed on component receiving member 392 in a state in which lead 414 is directed downward in the vertical direction, as illustrated in FIG. 10.

When lead component 410 is placed on component receiving member 392, component carrier 388 is moved to the component supply position through an operation of component carrier moving device 390. Component carrier 388 moved to the component supply position is located within the moving range of work heads 60 and 62, and thus lead component 410 is supplied to component mounter 10 at this position in bulk component supply device 32. As described above, in bulk component supply device 32, lead component 410 is supplied such that lead 414 is directed downward and the upper surface is directed upward, the upper surface being a surface opposing the bottom surface connected to lead 414. Consequently, suction nozzles 66 of work heads 60 and 62 can suitably hold corresponding lead components 410.

As described above, in bulk component supply device 32, when pickup target components are scattered on stage 156 of component support member 150, the scattered pickup target components are repeatedly picked up, so that the picked-up pickup target components are placed on component receiving member 392. Attached component carrier 388 of component receiving member 392 is moved to the component supply position, and thus lead components 410 are supplied. However, in a case where there are no pickup target components scattered on stage 156 of component support member 150, lead component 410 cannot be picked up from stage 156. That is, in a case where all lead components 410 determined as pickup possible components have been picked up and thus it is determined that lead components 410 cannot be picked up, or lead component 410 determined as being unavailable for determination remains on stage 156, lead component 410 cannot be picked up from stage 156.

Thus, in such a case in bulk component supply device 32, lead components 410 remaining on stage 156 are collected in component accommodation container 180. Lead components 410 collected in component accommodation container 180 are then scattered on stage 156 again, and the postures of lead components 410 are changed, and thus picking up of lead components 410 from stage 156 is resumed.

Specifically, when all pickup target components on stage 156 are picked up, component support member 150 is moved below component feeder 88 through an operation of component support member moving device 152. That is, component support member 150 is moved from the exposed state (refer to FIG. 5) to the retracted state (refer to FIG. 6). In this case, component accommodation container 180 disposed at the front end part of component support member 150 is in a posture (collecting posture) in which the opening is directed upward. When component support member 150 is moved from the exposed state toward the retracted state, lead components 410 on stage 156 of component support member 150 are held back by the front end part of inclined plate 128 of component feeder 88.

Figure 6:
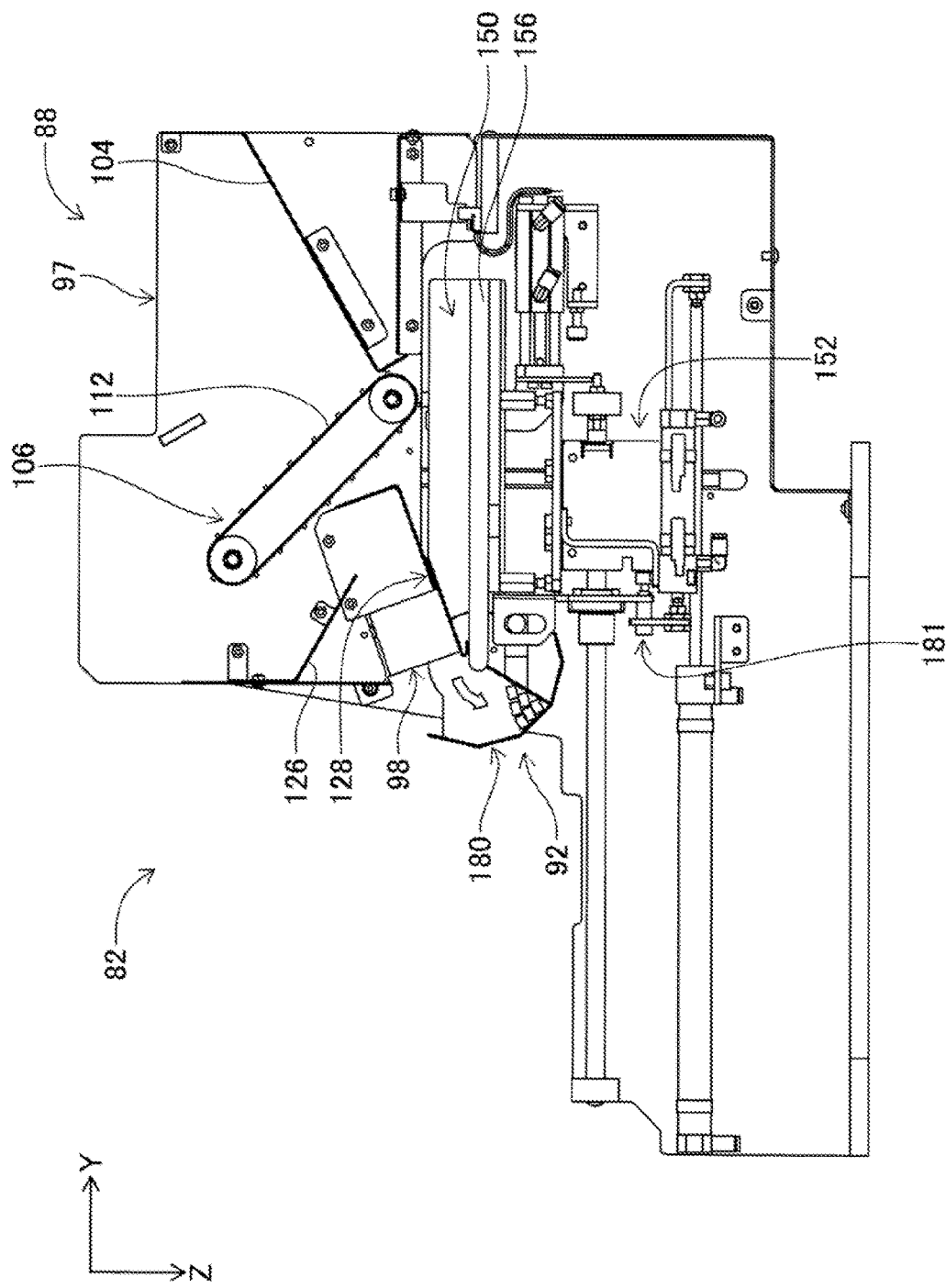
FIG. 6 is a transparent view illustrating the component supply unit.

As illustrated in FIG. 6, when component support member 150 is moved to the retracted state, lead components 410 on stage 156 are scraped off into component accommodation container 180. Consequently, lead components 410 on stage 156 are collected in component accommodation container 180. As described above, when lead components 410 on stage 156 are collected in component accommodation container 180, the collected lead components 410 are replenished onto stage 156 again.

That is, when the collection of lead components 410 in component accommodation container 180 is completed, component support member 150 is in the retracted state as illustrated in FIG. 6. Thus, component support member 150 is moved from the retracted state toward the front through an operation of component support member moving device 152. Container swing device 181 of component return device 92 is operated at a timing at which component support member 150 has been moved a predetermined amount from the retracted state toward the front, and swings component accommodation container 180. Consequently, a posture of component accommodation container 180 changes vigorously from a posture (accommodating posture) in which the opening is directed upward to a posture (return posture) in which the opening is directed toward stage 156.

In this case, lead components 410 accommodated in component accommodation container 180 are vigorously released toward stage 156. Consequently, lead components 410 are scattered on stage 156 from component accommodation container 180. That is, lead components 410 collected in component accommodation container 180 are replenished onto stage 156. Consequently, postures of the replenished lead components 410 are changed and thus lead components 410 are picked up again from stage 156.

As described above, in bulk component supply device 32, when all of the pickup target components are picked up from stage 156, lead components 410 on stage 156 are collected in component accommodation container 180. Lead components 410 collected in component accommodation container 180 are scattered again on stage 156, and thus postures of lead components 410 are changed such that lead components 410 are picked up again from the upper side of stage 156. In other words, when lead components 410 collected in component accommodation container 180 are scattered again on stage 156, the component on stage 156 is imaged by camera 290, and a pickup target component is specified based on imaging data, so that the pickup target component is held by component holding head 302.

In this case, it is preferable that the probability that lead component 410 scattered from component accommodation container 180 on stage 156 enters the first posture or the second posture, that is, the probability of becoming a pickup target component (hereinafter, referred to as the "holdable probability") is high. As a holdable probability increases, the number of times work of collecting lead component 410 in component accommodation container 180 and work of replenishing lead component 410 from component accommodation container 180 onto stage 156 are performed decreases. Consequently, it is possible to reduce the time required for the collecting work and the replenishing work. Since a load is applied to lead component 410 in the collecting work and the replenishing work, lead component 410 may be damaged or broken, so that when the number of times of the collecting work and the replenishing work is reduced, a load on lead component 410 can be reduced. In view of this, in bulk component supply device 32, a holdable probability is calculated every time components are scattered from component accommodation container 180 onto stage 156.

Specifically, when components are scattered from component accommodation container 180 onto stage 156, the components on stage 156 are imaged by camera 290, and a pickup target component is specified based on imaging data. In this case, not only the position information and the posture information but also information indicating the number of components (hereinafter, referred to as "number information") is calculated based on the imaging data. Here, as the number information, a total number of lead components 410 scattered on stage 156 (hereinafter, referred to as a "total number of components"), the number of pickup target components (hereinafter, referred to as a "holdable number"), and the number of overlapping lead components 410 (hereinafter, referred to as a "stacked number"), are calculated.

Specifically, based on the imaging data, an area of stage 156 on which lead components 410 are placed and which are occupied by lead components 410 in stage 156 on which lead components 410 are scattered (hereinafter, referred to as a "component occupation area") is calculated. That is, for example, an outline of each of multiple components is recognized based on the imaging data, and an area of a location surrounded by each outline is calculated as the component occupation area.

Stage 156 is imaged by camera 290 before lead components 410 are scattered on stage 156, that is, in a state in which no component is placed on stage 156. An area of stage 156 (hereinafter, referred to as a "stage area") is calculated based on the imaging data. By dividing the component occupation area by the stage area, a ratio occupied by a location on which the component is placed on stage 156 (hereinafter, referred to as a "component occupancy ratio") is calculated. Naturally, the higher the component occupancy ratio, the larger the total number of components placed on stage 156, that is, a total number of components, and the lower the component occupancy ratio, the smaller the total number of components. Therefore, a relationship between the component occupancy ratio and the total number of components is substantially proportional relationship, and the proportional relationship is stored in storage device 458 as map data. Therefore, when the component occupancy ratio is calculated, the total number of components is calculated by referring to the map data.

Based on the component occupation area and the stage area, a location on stage 156 where a component is not placed, that is, a ratio of a vacant space (hereinafter, referred to as a "vacant space ratio") is also calculated. Specifically, a vacant space area is calculated by subtracting the component occupation area from the stage area, and a vacant space ratio is calculated by dividing the vacant space area by the stage area.

The holdable number is counted when the pickup target component is specified through the pattern matching according to the above-described procedure. The holdable number is counted for each posture of the component. That is, the number of lead components 410a in the first posture is counted as holdable number A, and the number of lead components 410b in the second posture is counted as holdable number B. Consequently, holdable number A and holdable number B are calculated. When the total number of components, holdable number A, and holdable number B are calculated, the holdable probability is calculated by dividing a total number of holdable number A and holdable number B by the total number of components.

As illustrated in FIG. 12, since lead components 410d in an overlapping state cause multiple lead components to be integrally recognized as one component, in a case where an outline of the components is recognized based on the imaging data, the outline of the components is larger than lead components in the first posture and the second posture. Therefore, when the outline of the components is recognized based on the imaging data and the pattern matching is performed, a shape of the recognized components does not match the first storage component shape and the second storage component shape, and components larger than the first storage component shape or larger than the second storage component shape are counted as the stacked number. Consequently, the stacked number is calculated.

As described above, when the total number of components, holdable number A, holdable number B, the holdable probability, the vacant area ratio, and the stacked number are calculated, the information is stored in storage device 458. The total number of components, holdable number A, holdable number B, the holdable probability, the vacant area ratio, and the stacked number are calculated each time a component is replenished from component accommodation container 180 onto stage 156, and are stored in storage device 458 in association with the number of times the component is replenished. That is, for example, as illustrated in FIG. 14, the total number of components, holdable number A, holdable number B, the holdable probability, the vacant area ratio, the stacked number at the time of the first replenishment, the total number of components, holdable number A, holdable number B, the holdable probability, the vacant area ratio, the stacked number at the time of the second replenishment, and the like are stored for each replenishment.

As described above, each time a component is replenished from component accommodation container 180 onto stage 156, the total number of components, holdable number A, holdable number B, the holdable probability, the vacant area ratio, and the stacked number are continuously stored, so that various notification screens are displayed on display panel 460 in bulk component supply device 32.

Specifically, as illustrated in FIG. 12, lead component 500 that is of a different type from that of lead component 410 and defective products 410a1 and 410b1 in which lead 414 is bent may be scattered on stage 156. Lead component 500 and defective products 410a1 and 410b1 are not set as pickup target components as described above. Therefore, no matter how many times work of replenishing components from component accommodation container 180 is executed, those three components are not picked up from stage 156. Such a component is called an immovable component, and a holdable probability is reduced due to the immovable component. In particular, as the number of replenishments increases and a total number of components decreases, a holdable probability decreases due to the immovable component.

For example, in a case where a theoretical value of the holdable probability in a case where lead components 410 are scattered on stage 156 is 50%, if there are no immovable components in fifty lead components 410, the number of 50% of fifty components, that is, twenty-five lead components 410 are pickup target components. On the other hand, as illustrated in FIG. 12, in a case where three immovable components are scattered on stage 156 and a total number of components on stage 156 at this time is fifty, 50% of forty-seven components, that is, 23.5 lead components 410 are pickup target components in theoretical terms. That is, a theoretical value of the pickup target components is 23.5.

FIG. 14 illustrates a total number of components calculated in a case where components including three immovable components are scattered on stage 156. In FIG. 14, the total number of components calculated at the time of the first replenishment is fifty, and a holdable number (A+B), that is, the number of pickup target components is twenty-four. The number of pickup target components (24) calculated at the time of the first replenishment is a numerical value close to the theoretical value (23.5) of the pickup target components. The holdable probability calculated at the time of the first replenishment is 48%, which is substantially the same as the theoretical value (50%) of the holdable probability.

After twenty-four pickup target components are picked up from stage 156, the remaining twenty-six components are accommodated in component accommodation container 180, and are scattered from component accommodation container 180 onto stage 156 again. In this case, since three out of a total of twenty-six components are immovable components, a theoretical value of the pickup target components is 50% of 23, that is, 11.5. In FIG. 14, the holdable number (A+B) calculated at the time of the second replenishment, that is, the number of pickup target components is eleven. The number of pickup target components (11) calculated at the time of the second replenishment is a numerical value close to the theoretical value (11.5) of the pickup target components. On the other hand, the holdable probability calculated at the time of the second replenishment is 42%, which is lower than the theoretical value (50%) of the holdable probability. That is, the holdable probability calculated at the first replenishment is 48%, but the holdable probability calculated at the second replenishment is 42%, which is lower than the theoretical value (50%) of the holdable probability. This is because the ratio (3/26) of the immovable component to the total number of components when the holdable probability is calculated at the time of the second replenishment increases by about twice the ratio (3/50) of the immovable component to the total number of components when the holdable probability is calculated at the time of the first replenishment.

After the eleven pickup target components are picked up from stage 156, the remaining fifteen components are accommodated in component accommodation container 180, and are scattered again from component accommodation container 180 onto stage 156. In this case, since three out of a total of fifteen components are immovable components, a theoretical value of the pickup target components is 50% of 12, that is, 6. In FIG. 14, the holdable number (A+B) calculated at the time of the third replenishment, that is, the number of pickup target components is six. The number of pickup target components (6) calculated at the time of the third replenishment is the same as the theoretical value (6) of the pickup target components. On the other hand, the holdable probability calculated at the time of the third replenishment is 40%, which is lower than the theoretical value (50%) of the holdable probability. That is, the holdable probability calculated at the first replenishment is 48%, but the holdable probability calculated at the third replenishment is 40%, which is still lower than the theoretical value (50%) of the holdable probability. This is because the ratio (3/15) of the immovable components to the total number of components when the holdable probability is calculated at the time of the third replenishment increases by about 3.3 times the ratio (3/50) of the immovable components to the total number of components when the holdable probability is calculated at the time of the first replenishment.

After the six pickup target components are picked up from stage 156, the remaining nine components are accommodated in component accommodation container 180, and are scattered again from component accommodation container 180 onto stage 156. In this case, since three out of a total of the nine components are immovable components, a theoretical value of the pickup target components is 50% of 6, that is, 3. In FIG. 14, the holdable number (A+B) calculated at the time of the fourth replenishment, that is, the number of pickup target components is three. The number of pickup target components (3) calculated at the time of the fourth replenishment is the same as the theoretical value (3) of the pickup target component. On the other hand, the holdable probability calculated at the time of the fourth replenishment is 33%, which is lower than the theoretical value (50%) of the holdable probability. That is, the holdable probability calculated at the first replenishment is 48%, but the holdable probability calculated at the fourth replenishment is 33%, which is significantly lower than the theoretical value (50%) of the holdable probability. This is because the ratio (3/9) of the immovable components to the total number of components at the time of the fourth replenishment increases by five times or more the ratio (3/50) of the immovable components to the total number of components at the time of the first replenishment.

Figure 15:
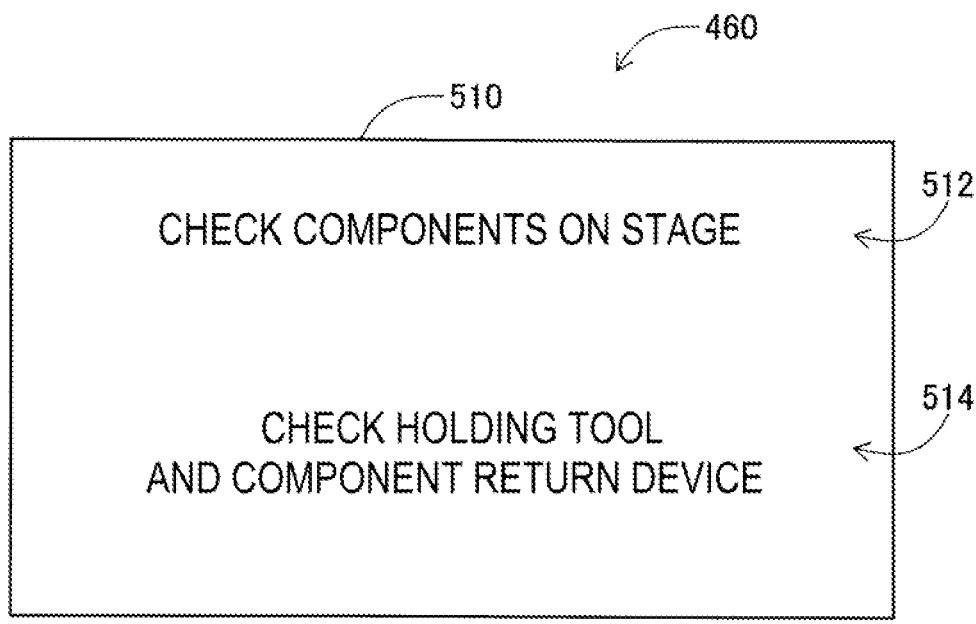
FIG. 15 is a diagram illustrating a notification screen.

As described above, as the number of replenishments increases and a total number of components decreases, a ratio of the immovable components to the total number of components increases, so that a holdable probability calculated at the time of replenishment decreases. In other words, if there is an immovable component on stage 156, as the number of replenishments increases, a holdable probability calculated at the time of replenishment decreases. On the other hand, if there is no immovable component on stage 156, a holdable probability calculated at the time of replenishment does not decrease even if the number of replenishments increases, so that the holdable probability is substantially equal to a theoretical value of the holdable probability. In view of this, in bulk component supply device 32, in a case where the holdable probability calculated every time a component is supplied from component accommodation container 180 to stage 156 is equal to or less than a reference value with reference to the theoretical value of the holdable probability, a notification screen for warning mixing of the immovable component is displayed on display panel 460. The reference value is set to a value 10% lower than the theoretical value (50%) of the holdable probability, for example, in consideration of an error or the like. Therefore, in a case where 40% is set as a reference value and a calculated holdable probability becomes 40% or less, that is, when the holdable probability is calculated at the time of the third replenishment, as illustrated in FIG. 15, notification screen 510 for warning mixing of the immovable component is displayed on display panel 460.

Comment 512 for prompting an operator to check the components on stage 156 is displayed on notification screen 510. Consequently, in a case where an immovable component is mixed on stage 156, an operator removes the immovable component, and thus it is possible to prevent the decrease in a holdable probability. When a component is held from stage 156 by suction nozzle 332, in a case where any abnormality has occurred in suction nozzle 332, the component may be broken when the component is held by suction nozzle 332. When components accommodated in component accommodation container 180 are scattered on stage 156, the components may be broken in a case where any abnormality has occurred in component return device 92. In other words, normal lead components 410 may be defective products 410$a$1 and 410$b$1 through an operation of suction nozzle 332 or component return device 92. Accordingly, a comment 514 for prompting checking of a holding tool holding a component, that is, suction nozzle 332, and component return device 92 is also displayed on notification screen 510. Consequently, it is possible to suppress generation of defective products 410$a$1 and 410$b$1, and to prevent the decrease in a holdable probability.

As a factor of reducing a holdable probability calculated at the time of replenishment, pattern matching may not be appropriately executed based on imaging data in addition to an immovable component. Specifically, when pattern matching is performed based on imaging data, the imaging data is subjected to image processing, and binarization is performed, for example, in units of pixels in the image processing. In this case, it is determined whether numerical values of the luminance, the hue, the brightness, and the like of each pixel are equal to or greater than threshold values, and an outline of a component is recognized by performing binarization in units of pixels. Therefore, in the image processing based on the imaging data, a threshold value of a numerical value of the luminance or the like is set as a parameter, and the image processing is executed with reference to the parameter. However, an outline of a component may not be appropriately recognized due to conditions such as an exposure amount and the brightness at the time of imaging. As described above, if an outline of a component cannot be appropriately recognized, a pickup target component cannot be specified, and a holdable probability decreases.

In view of this, in a case where the holdable probability calculated at the time of replenishment decreases, specifically, in a case where the holdable probability calculated at the time of replenishment becomes equal to or less than the reference value (40%), parameters in the image processing are changed. The binarization is performed in units of pixels with reference to the changed parameters, and pattern matching based on the imaging data is executed. Consequently, it is possible to prevent a decrease in the holdable probability by appropriately recognizing an outline of a component and appropriately specifying a pickup target component. As described above, in bulk component supply device 32, in a case where a holdable probability calculated at the time of replenishment is equal to or less than the reference value (40%), notification screen 510 is displayed on display panel 460, and the parameters in the image processing are changed, so that the holdable probability is prevented from decreasing.

In bulk component supply device 32, a notification screen for prompting an operator to change a supply interval of a component from component feeder 88 is displayed on display panel 460 based on a stacked number, a holdable number, and the like calculated at the time of replenishment. Specifically, the stacked number is the number of components overlapping each other on stage 156, and the holdable number is the number of components that can be picked up from the upper side of stage 156. In a case where the number of components overlapping each other on stage 156 is large although the number of components that can be picked up from the upper side of stage 156 is small, it can be assumed that the number of components supplied on stage 156 is too large.

Figure 16:
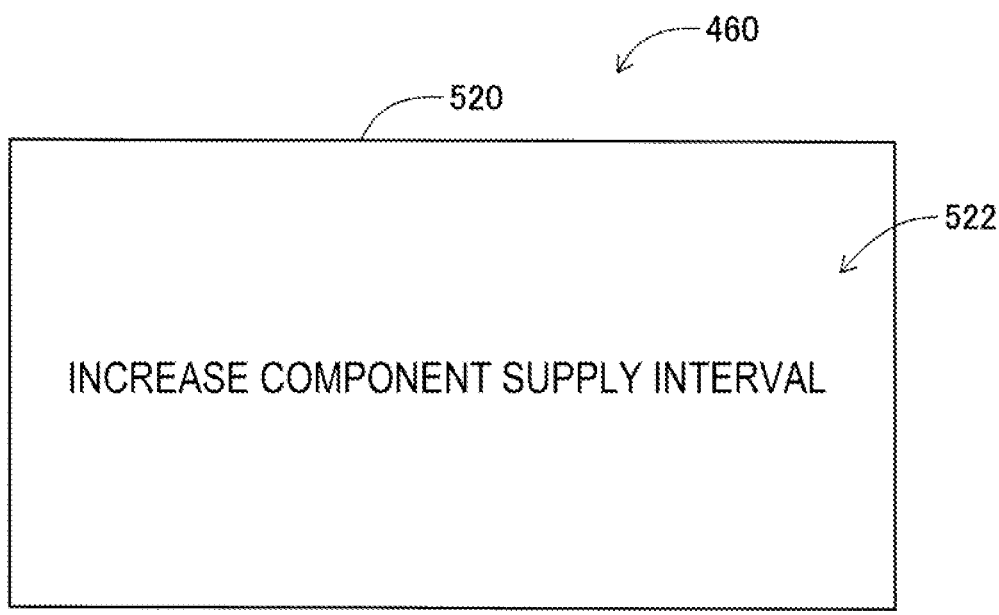
FIG. 16 is a diagram illustrating a notification screen.

Therefore, in a case where a stacked number calculated at the time of replenishment exceeds a preset maximum stacked number and a holdable number calculated at the time of replenishment is smaller than a preset minimum holdable number, as illustrated in FIG. 16, notification screen 520 for prompting suppression of the number of components supplied on stage 156 is displayed on display panel 460. Comment 522 for prompting an operator to increase a supply interval of a component supplied from component feeder 88 to stage 156 is displayed on notification screen 520. An operator increases the component supply interval according to comment 522, and thus it is possible to suppress the number of components on stage 156. Consequently, it is possible to increase a holdable probability by suppressing overlap of components on stage 156 and increasing the number of components that can be picked up from the upper side of stage 156.

On the other hand, in a case where the number of components overlapping each other on stage 156 is small and the number of components that can be picked up from the upper side of stage 156 is also small, it can be assumed that the number of components supplied on stage 156 is too small if an area where components on stage 156 are not placed is large. Therefore, in a case where a stacked number is smaller than a set minimum stacked number that is preset and the holdable number is smaller than a preset minimum holdable number, a notification screen (not illustrated) for prompting an operator to increase the number of components supplied on stage 156 is displayed on display panel 460 on the condition that a vacant area ratio is larger than a set ratio. The notification screen displays a comment for prompting the operator to reduce a supply interval of components supplied from component feeder 88 to stage 156. The operator reduces the component supply interval according to the comment, and thus the number of components on stage 156 can be increased. Consequently, by increasing the number of components that can be picked up from the upper side of stage 156, it is possible to increase a holdable probability.

Individual control device 452 of bulk component supply device 32 includes calculation section 550, storage section 552, holding section 554, determination section 556, changing section 558, and replenishment section 560. Calculation section 550 is a functional section for calculating position information indicating a position of a component on stage 156, posture information indicating a posture of the component, and number information indicating the number of components based on imaging data. Storage section 552 is a functional section for storing the calculated position information, posture information, and number information in storage device 458. Holding section 554 is a functional section for holding a component with suction nozzle 332 based on the calculated position information and posture information. Determination section 556 is a functional section for determining whether to change parameters in image processing based on the calculated number information. Changing section 558 is a functional section for changing parameters in the image processing in a case where it is determined by determination section 556 that the parameters will be changed. Replenishment section 560 is a functional section for operating conveyor device 106 of component feeder 88 to replenish components from component feeder 88 to stage 156.

Bulk component supply device 32 is an example of a component supply device. Stage 156 is an example of a stage. Camera 290 is an example of an imaging device. Suction nozzle 332 is an example of a holding tool. Individual control device 452 is an example of a calculation device. Storage device 458 is an example of a storage device. The step executed by calculation section 550 is an example of a calculation step. The step executed by storage section 552 is an example of a storage step. The step executed by holding section 554 is an example of a holding step. The step executed by determination section 556 is an example of a determination step. The step executed by changing section 558 is an example of a changing step. The step executed by replenishment section 560 is an example of a replenishment step.

The present invention is not limited to the above examples, and can be performed in various aspects to which various modifications and improvements are applied based on the knowledge of those skilled in the art. Specifically, for example, in the above examples, a notification screen for prompting an operator to change a supply interval of a component from component feeder 88 is displayed on display panel 460 based on a stacked number, a holdable number, and the like calculated at the time of replenishment, but a component supply interval may be automatically changed. In other words, in a case where the stacked number exceeds the maximum stacked number and the holdable number is smaller than the minimum holdable number, a component supply interval may be automatically increased. In a case where the stacked number is smaller than the minimum stacked number and the holdable number is smaller than the minimum holdable number, the component supply interval may be automatically reduced on the condition that a vacant area ratio is higher than a setting ratio. As described above, a step of automatically changing a component supply interval is an example of a changing step.

In the above examples, the display of the notification screen and the change of the parameters in the image processing are performed based on the number information such as a holdable probability stored in storage device 458, but various pieces of work can be performed based on the number information. For example, in a case where multiple components on stage 156 are imaged, an order in which image processing on the multiple components is executed based on the imaging data may be determined based on the number information. Specifically, in a case where a large number of components are placed on the left side of stage 156, image processing may be executed from a component located on the left side.

In the above examples, camera 290 having a wide angle of view is employed, and imaging of entire stage 156 can be performed at one time, but in a case where a camera having a narrow angle of view is employed, stage 156 may be divided into multiple regions and imaging may be performed multiple times.

In the above examples, a total number of components is calculated based on a component occupation area, but the total number of components may be calculated according to various methods. For example, outlines of components in various postures may be distinguished based on the imaging data, and the total number of components may be calculated based on the distinguished outlines.

In the above examples, the present invention is applied to lead component 410, but the present invention can be applied to various types of components. Specifically, the present invention can be applied to, for example, solar cell components, power module components, and electronic circuit components having no leads.

REFERENCE SIGNS LIST

32: Bulk component supply device (component supply device), 156: Stage, 290: Camera (imaging device), 332: Suction nozzle (holding tool), 452: Individual control device (control device), 458: Storage device, 550: Calculation section (calculation step), 552: Storage section (storage step), 554: Holding section (holding step), 556: Determination section (determination step), 558: changing section (changing step), 560: Replenishment section (replenishment step)

The invention claimed is:

1. A component supply method of supplying components scattered on a stage, the component supply method comprising:
   a replenishment step of replenishing the components on the stage;
   a storage step of storing position information indicating a position of the components, posture information indicating a posture of the components, and number information indicating a number of the components based on imaging data of the components scattered on the stage after the replenishing; and
   a holding step of holding the components scattered on the stage with a holding tool based on the position information and the posture information stored in the storage step, wherein
   in the storage step, the number information is stored for each piece of the posture information, and
   the number information includes a number of all components on the stage, a number of components holdable by the holding tool, and a number of components overlapping each other on the stage.

2. The component supply method according to claim 1 further comprising:
   a changing step of changing an interval of the replenishment step based on the position information, the posture information, and the number information.

3. A component supply method of supplying components scattered on a stage, the component supply method comprising:
   a calculation step of calculating position information indicating a position of a component, posture information indicating a posture of the component, and number information indicating a number of components based on imaging data of the components scattered on the stage;
   a holding step of holding the components scattered on the stage with a holding tool by using the position information and the posture information calculated in the calculation step;
   a determination step of determining whether to change parameters at a time of image processing on the imaging data in the calculation step based on the number information calculated in the calculation step; and
   a changing step of changing the parameters at the time of the image processing on the imaging data in the calculation step in a case where it is determined to change the parameters in the determination step.

4. The component supply method according to claim 3, wherein
   the parameters are used for recognizing an outer edge of the components based on the imaging data.

5. The component supply method according to claim 1, wherein
   the number of components holdable by the holding tool is holdable from an upper side of the stage.

6. A component supply device comprising:
   a stage on which components are scattered;
   a holding tool configured to hold the components scattered on the stage;
   an imaging device configured to image the components scattered on the stage; and
   a storage device configured to store position information indicating a position of a component, posture information indicating a posture of the component, and number information indicating a number of components based on imaging data of the components from the imaging device, wherein
   the holding tool holds the components scattered on the stage based on the position information and the posture information stored in the storage device.

7. A component supply device comprising:
   a stage on which components are scattered;
   a holding tool configured to hold the components scattered on the stage;
   an imaging device configured to image the components scattered on the stage; and
   a calculation device configured to calculate position information indicating a position of a component, posture information indicating a posture of the component, and number information indicating a number of components based on imaging data of the components from the imaging device, wherein
   the holding tool holds the components scattered on the stage by using the position information and the posture information calculated by the calculation device, and
   in a case where the number information indicates a predetermined numerical value, the calculation device changes parameters at a time of image processing on the imaging data and calculates the number information based on the imaging data.

* * * * *